(12) United States Patent
Lichtensteiger et al.

(10) Patent No.: US 8,440,129 B2
(45) Date of Patent: May 14, 2013

(54) PRODUCTION OF FREE-STANDING SOLID STATE LAYERS BY THERMAL PROCESSING OF SUBSTRATES WITH A POLYMER

(75) Inventors: Lukas Lichtensteiger, Zurich (CH); Christian Pfeffer, Somerville, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 33 days.

(21) Appl. No.: 12/740,373

(22) PCT Filed: Oct. 24, 2008

(86) PCT No.: PCT/US2008/012140
§ 371 (c)(1),
(2), (4) Date: Jul. 22, 2010

(87) PCT Pub. No.: WO2009/061353
PCT Pub. Date: May 14, 2009

(65) Prior Publication Data
US 2010/0289189 A1    Nov. 18, 2010

(30) Foreign Application Priority Data

Nov. 2, 2007   (CH) ....................................... 1712/07
Nov. 30, 2007  (CH) ....................................... 1851/07

(51) Int. Cl.
*B29C 67/00*    (2006.01)
(52) U.S. Cl.
USPC ........................................................ 264/492
(58) Field of Classification Search ................... 264/492
See application file for complete search history.

(56) References Cited

U.S. PATENT DOCUMENTS

| | | | |
|---|---|---|---|
| 3,901,423 | A | 8/1975 | Hillberry et al. |
| 4,370,288 | A | 1/1983 | Rice, Jr. et al. |
| 4,582,559 | A | 4/1986 | Tanielian |
| 5,448,817 | A | 9/1995 | Waldsmith |
| 5,918,587 | A | 7/1999 | Hasegawa et al. |
| 6,100,166 | A | 8/2000 | Sakaguchi et al. |
| 6,372,610 | B1 | 4/2002 | Chang et al. |

(Continued)

FOREIGN PATENT DOCUMENTS

| | | |
|---|---|---|
| EP | 0858110 A1 | 8/1998 |
| EP | 1069602 A2 | 1/2001 |

(Continued)

OTHER PUBLICATIONS

Hemanth et al., "Strain energy release rates for an interface crack in orthotropic media—a finite element investigation," Engineering Fracture Mechanics, vol. 72, Issue 5, pp. 7590772, Mar. 2005.

(Continued)

*Primary Examiner* — Larry Thrower
(74) *Attorney, Agent, or Firm* — Theresa A. Lober

(57) ABSTRACT

In a method for producing a free-standing solid state layer, a solid state material is provided having at least one surface available for layer formation thereon and a layer of polymer is formed on the available surface. The solid state material and polymer layer are then exposed to a change in local temperature from a first temperature that is no greater than about 300° C. to a second temperature below about room temperature to cause the solid state material to fracture along a plane at a depth in the material, to produce at least one free-standing solid state layer from the solid state material.

30 Claims, 2 Drawing Sheets

U.S. PATENT DOCUMENTS

| | | | |
|---|---|---|---|
| 6,382,292 | B1 | 5/2002 | Ohmi et al. |
| 6,452,091 | B1 | 9/2002 | Nakagawa et al. |
| 6,596,569 | B1 | 7/2003 | Bao et al. |
| 6,682,990 | B1 | 1/2004 | Iwane et al. |
| 6,887,770 | B2 | 5/2005 | Ueda et al. |
| 7,038,277 | B2 | 5/2006 | Chu et al. |
| 7,060,154 | B2 | 6/2006 | Yamamoto et al. |
| 7,140,102 | B2 | 11/2006 | Taliashvili et al. |
| 7,195,733 | B2 | 3/2007 | Rogers et al. |
| 7,351,300 | B2 | 4/2008 | Takayama et al. |
| 7,514,341 | B2 | 4/2009 | Neyret et al. |
| 7,749,884 | B2 | 7/2010 | Mathew et al. |
| 8,076,215 | B2 | 12/2011 | Mathew et al. |
| 2004/0110395 | A1 | 6/2004 | Ueda et al. |
| 2006/0240644 | A1 | 10/2006 | Le Vaillant |
| 2007/0235074 | A1 | 10/2007 | Henley et al. |
| 2007/0249140 | A1 | 10/2007 | Dross et al. |
| 2009/0040507 | A1 | 2/2009 | VanWiggeren |
| 2009/0042369 | A1 | 2/2009 | Henley |

FOREIGN PATENT DOCUMENTS

| | | |
|---|---|---|
| EP | 0670589 B1 | 10/2001 |
| EP | 0849788 B1 | 3/2004 |
| EP | 0726486 B1 | 4/2005 |
| EP | 1863100 A1 | 2/2007 |
| EP | 1858087 A2 | 11/2007 |
| EP | 2019418 A2 | 1/2009 |
| EP | 2088632 A3 | 3/2011 |
| WO | 2009137604 A2 | 11/2009 |
| WO | 2009137610 A2 | 11/2009 |
| WO | 2009143026 A2 | 11/2009 |
| WO | 2010072675 A2 | 7/2010 |

OTHER PUBLICATIONS

PCTUS2008/012140, PCT International Search Report, Form PCT/ISA/210 first sheet, second sheet, and patent family annex; and Written Opinion of the International Searching Authority Form PCT/ISA/237 cover sheet and pp. 1-2, PCT/ISA/237 Separate sheet and Sheets 1-3, Jul. 2009.

European Patent Application No. 08847768.2-1235, Examination Report, pp. 1-6, Nov. 2011.

European Patent Application No. 08847768.2-1235, Response to Examination Report, pp. 1-7, May 2012.

Mexican Patent Application No. MX/A/2010/004896, Office Action No. 92740, pp. 1-2, Nov. 2011.

Mexican Patent Application No. MX/A/2010/004896, Response to Office Action No. 92740, pp. 1-11, Apr. 2012.

Russian Patent Application No. 2010122313/09(031739), Official Action, pp. 1-5, May 2012.

Russian Patent Application No. 2010122313/09(031739), Response to Official Action, pp. 1-10, Jul. 2012.

"AstroWatt Exfoliates to Reduce Solar Silicon Costs," Gunther Portfolio, http://guntherportfolio.com/2009/astrowatt-expoliates-to-reduce-solar-silicon-wafer-costs/, pp. 1-12, Nov. 2009.

Barnett et al., "Very High Efficiency Solar Cell Modules," Prog. Photovolt: Res. Appl., www.interscience.wiley.com, DOI 10.1002/pip.852, pp. 1-9, 2008.

Blakers et al., "Sliver Cells—A complete photovoltaic solution," 2006 IEE 4th World Conf. on Photovoltaic Energy Conversion, Hawaii, pp. 2181-2184, May 2006.

Bowden et al, "The controlled formation of ordered, sinusoidal structures by plasma oxidation of an elastomeric polymer," Appl,. Phys., Letts., vol. 75, No. 17, pp. 2557-2559, Oct. 1999.

Bowden et al., "Spontaneous formation of ordered structures in thin films of metals supported on an elastomeric polymer," Nature, vol. 393, pp. 146-149, May 1998.

Carroll et al., "Advances in PV metallisation technology," 20th European Photovoltaic Solar Energy Conf., Barcelona, Spain, pp. 906-908, Jun. 2004.

Chiu et al., "An analysis of chipping in brittle materials," Int. Jnl. Fracture, vol. 90, pp. 287-298, 1998.

Rogol et al., "Solar power sector outlook," CLSA Asia-Pacific Markets, pp. 1-79, Jul. 2005.

Cook et al., "Mechanisms Active during Fracture under Contraint," MRS Bulletin, pp. 45-51, Jan. 2002.

O'Rourke et al., "Solar Photovoltaic Industry Looking Through the Storm," Deutsche Bank FITT Research, pp. 1-95, Jan. 2009.

Dross et al., "Stress-induced large-area lift-off of cystalline Si films," Appl. Phys. A, vol. 89, pp. 149-152, Jul. 2007.

Dross et al., "Slim-cut: A kerf-loss-free method for wafering 50 um-thick crystalline Si wafers based on stress-induced lift-off," 23rd European Photovoltaic Solar Energy Conf. and Exb., Valencia, Spain, pp. 1278-1281, Sep. 2008.

Dross et al., "A new method for the produciton of ultra-thin crystalline Si wafers," 17th Int. Photovoltaic Science and Eng. Conf., PVSEC17, Fukuoka, Japan, pp. 1-2, Dec. 2007.

Fujimoto et al., "Influence of the Compositional Profile of Functionally Graded Material on the Crack Path under Thermal Schock," J. Am. Ceram. Soc., vol. 84, No. 7, pp. 1480-1486, 2001, presented at the Third Int. Congress on Thermal Stress, Crakow, Poland, pp. 519-522, Jun. 1999.

Green, "Crystalline Silicon Solar Cells," Clean electricity from photovoltaics, Chapter 4, pp. 1-49, Archer et al., Imperial College Press, Apr. 2001.

Hao et al., "Fracture mechanics for the design of ceramic multilayer actuators," J. Mech. Phys. Solids, vol. 44, No. 1, pp. 23-48, 1996.

Hauch et al., "Dynamic Fracture in Single Crystal Silicon," Phys. Rev. Letts., vol. 82, No. 19, pp. 3823-3826, May 1999.

He et al., "Comparison of Thin Film Cracking and Delamination for Aluminum and Copper Silicon Interconnects with Organic Packaging," 55th Electronic Components and Tech. Conf., Proc. vol. 1, pp. 346-355, May 2005.

Henley et al, "Kerf-free silicon wafering equipment configurations using beam-induced cleave technology," 23rd European Photovoltaic Solar Energy Conf. and Exhb., Valencia, Spain, pp. 2017-2019, Sep. 2008.

Henley et al., "Direct film transfer (DFT) technology for kerf-free silicon wafering," 23rd European Photovoltaic Solar Energy Conf. and Exhb., Valencia, Spain, pp. 1090-1093, Sep. 2008.

Huck et al., "Ordering of Spontaneously Formed Buckles on Planar Surfaces," Langmuir, vol. 16, pp. 3497-3501, Feb. 2000.

Hutchinson et al., "Mixed Mode Cracking in Layered Materials," Advances in Applied Mechanics, vol. 29, pp. 64-191. Academic Press, Inc., 1992.

IMEC Annual Report, Interuniversitair Micro-Electronica Centrum, Leuven, Belgium, pp. 1-80, 2007.

Kerschaver et al., "Challenges to Produce cells using thin wafers," Interuniversitair Micro-Electronica Centrum, Leuven, Belgium, Slides 1-20, 2009.

Van Kerschaver et al., "Back-contact Solar Cells: A Review," Prog. Photovolt. Res. Appl. vol. 14, pp. 107-123, Dec. 2005.

Liu et al., "Influences of heating temperature on mechanical properties of polydimethylsiloxane," Sensors and Actuators A, vol. 151, pp. 42-45, Feb. 2009.

McCann et al., "A Review of Thin Film Crystalline Silicon for Solar Cell Applications. Part 1: Native Substrates," Solar Energy Material and Solar Cells, vol. 68, Issue 2, pp. 135-171, 2001.

McIntosh et al., "The choice of silicon wafer for the production of low-cost rear-contact solar cells," 3rd World Conf. on Photovoltaic Energy Conversion, 4O-D10-05, Osaka Japan, pp. 971-974, May 2003.

Pang et al., "Mixed Mode Fracture Toughness Characterization for Interface and Interlayer Cracks in Adhesive Bonded Joints," 2000 Int. Symp. on Electronic Materials and Packaging, pp. 197-200, Nov. 2000.

"Stronger, Broader, Smarter," REC Annual Report, Renewable Energy Corp. ASA, Hovik Norway, pp. 1-123, 2006.

SiGen PolyMax Enhanced Thin PV Wafers Technology at a Glance, Silicon Genesis, Inc. San Jose, California, pp. 1-2, 2008.

Stocks et al., "65-micron thin monocrystalline silicon solar cell technology allowing 12-fold reduction in silicon usage," 3rd World Conf. on Photovoltaic Conversion, IP-D3-D4, pp. 184-187, Osaka, Japan, May 2003.

Suni, "Direction wafer bonding for MEMS and microelectronics," VTT Publication 609, Dr. of Science Dissertation, Helsinki University of Tech, pp. 1-92, 2006.

Swanson, "The Silicon PV Roadmap and How Synergies with the IC Industry Help Enable it," SunPower Corp., Slides 1-47, 2011.

Suo, "Channel cracks in thin films," class slides for course ES242r Fracture Mechanics, Harvard University, Slides 1-21, Feb. 2007.

Suo et al., "Interface crack between two elastic layers," International Jnl. of Fracture, vol. 43, pp. 1-18, 1990.

Suo et al., "Steady-state cracking in brittle substrates beneath adherent films," Int. J. Solids Structures, vol. 25, No. 11, pp. 1337-1353, 1989.

Suo, "Reliability of Interconnect Structures, Interfacial and Nanoscale Failure," Gerberic et al. Eds., vol. 8, pp. 265-324, Elsevier, Amsterdam, 2003.

Telford, "stretching silicon's lifespan," The Advanced Semiconductor Magazine, vol. 17, No. 7, pp. 36-39, Sep. 2004.

Thalladi et al., "Simulation of Indentation Fracture in Crystalline Materials Using Mesoscale Self-Assembly," JACS, vol. 124, pp. 9912-9917, Jul. 2002.

Thouless et al., "The edge cracking and spalling of brittle plates," Acta metall. vol. 35, No. 6, pp. 1333-1341, 1987.

Wong, "Modeling and Control of Rapid Cure in Polydimethylsiloxane (PDMS) for Microfluidic Device Applications," Doctor of Philosophy Thesis, Massachusetts Inst. of Technology, Cambridge, MA, pp. 1-151, Sep. 2010.

Yoon et al., "Ultrathin silicon solar microcells for semitransparent, mechanically flexible and microconcentrator module designs," nature materials, vol. 7, pp. 907-915, Oct. 2008.

Wong, "Modeling and Control of Rapid Cure in Polydimethylsiloxane (PDMS) for Microfluidic Device Applications," Thesis for the Doctor of Philosophy, Massachusetts Inst. of Technology, Cambridge, MA, pp. 1-151, Sep. 2010.

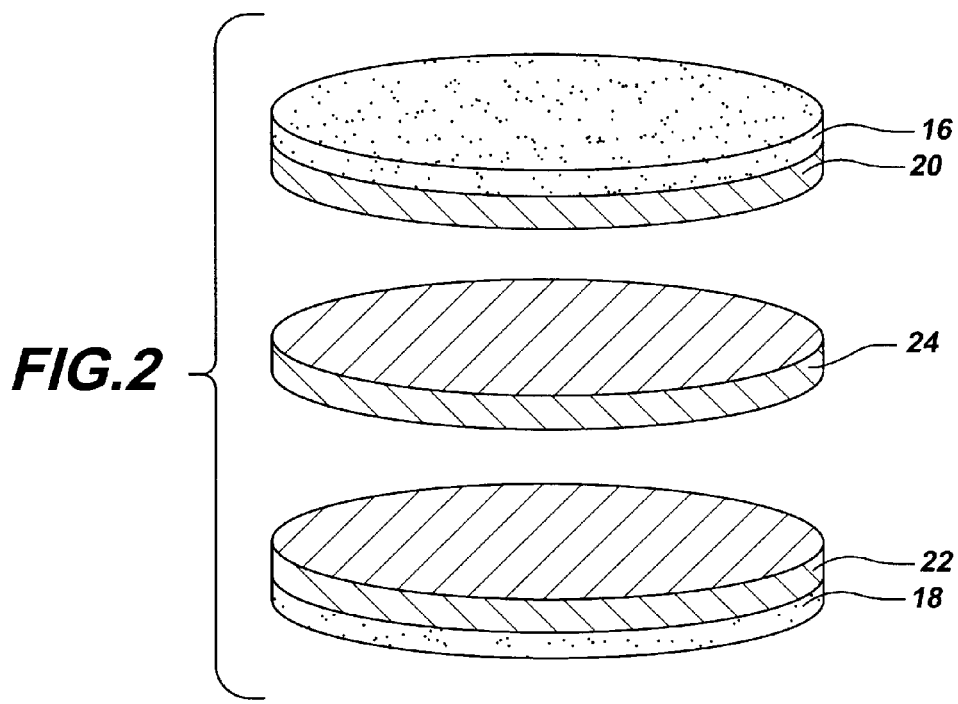
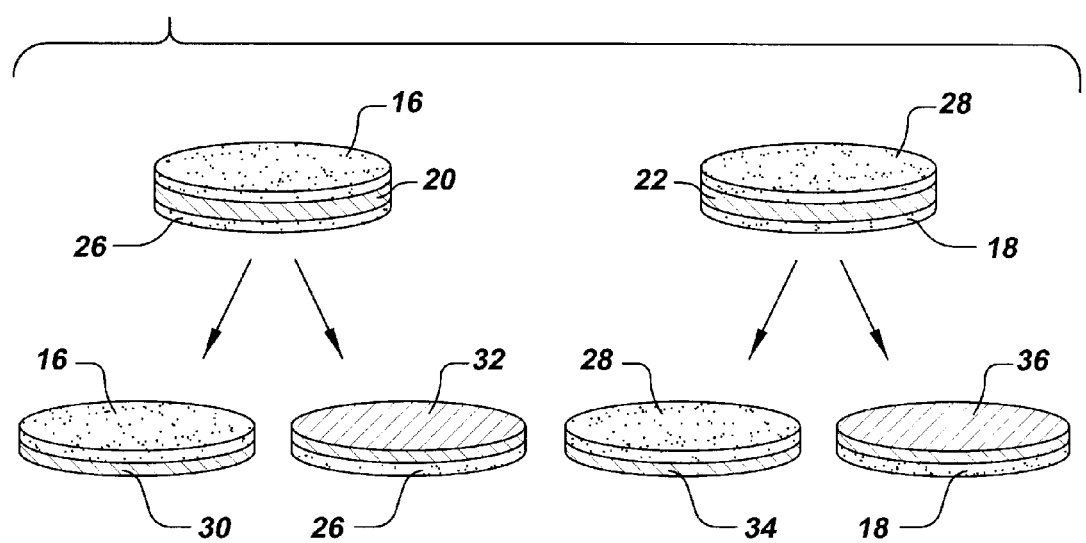

PRODUCTION OF FREE-STANDING SOLID STATE LAYERS BY THERMAL PROCESSING OF SUBSTRATES WITH A POLYMER

STATEMENT REGARDING FEDERALLY SPONSORED RESEARCH

This invention was made with Government support under Contract No. AR36819 and Contract No. AR053143, both awarded by NIH. The Government has certain rights in the invention.

RELATED APPLICATIONS

This application claims the right of priority under 35 U.S.C. §119(a)-(d) of Swiss Application No. 01712/07, filed Nov. 2, 2007, and Swiss Application No. 01851/07, filed Nov. 30, 2007, the entirety of both of which are hereby expressly incorporated by reference.

BACKGROUND OF INVENTION

This invention relates generally to the production of solid state material layers, and more particularly relates to techniques for producing relatively thin, free-standing layers of solid state materials such as microelectronic materials.

For a wide range of microelectronic and microfabrication applications there is required one or more free-standing layers of a microelectronic material to be employed, e.g., as a starting structure on which an electronic and/or mechanical system is to be fabricated. For example, conventional microfabrication processes employ one or more free-standing semiconductor substrates or wafers, such as silicon wafers, on which microelectronic and micromechanical systems are fabricated. Such silicon wafers are produced commercially to meet conventional industry standards for, e.g., doping uniformity and thickness.

Increasingly, the characteristics of commercially available microelectronic substrates such as silicon wafers do not correspond with requirements of important microfabrication applications. In particular, the thickness of conventional substrates such as silicon wafers often is substantially greater than that required for a given microfabrication application, with the unneeded wafer thickness adding cost to the overall microfabricated system but providing no corresponding benefit. For example, high-efficiency silicon solar cells can be produced with a silicon thickness of about 50 microns. But conventional 5-inch diameter silicon wafers produced for fabricating solar cells are typically about 180 μm in thickness. This excess thickness in wafer material provides no benefit to the solar cell operation but dominates the overall solar cell microfabrication expense. As this example demonstrates, in general, as advances in important microfabrication processes and systems such as solar cells and photovoltaic systems continue, the expense and limitations of conventional starting materials like commercial silicon wafers are becoming significant factors in determining the successful implementation and cost effectiveness of these evolving technologies.

SUMMARY OF THE INVENTION

The invention provides highly efficient, reproducible, and cost effective methods for producing free-standing solid state material layers that can be employed in a wide range of microfabrication applications.

In one example method provided by the invention for producing a free-standing solid state layer, a solid state material is provided having at least one surface available for layer formation thereon and a layer of polymer is formed on the available surface. The solid state material and polymer layer are then exposed to a change in local temperature from a first temperature to a second temperature below the first temperature to cause the solid state material to fracture along a plane at a depth in the material, to produce at least one free-standing solid state layer from the solid state material.

In embodiments provided by the invention, the first temperature can be no greater than about 300° C., or can be about room temperature. In further embodiments provided by the invention, the second temperature can be below about room temperature, or can be below about −20° C.

In an additional method provided by the invention for producing a free-standing solid state layer, a solid state material is provided having a characteristic first thermal expansion coefficient and having at least one surface available for layer formation thereon and a layer of polymer is formed on the available surface. The polymer is characterized by a second thermal expansion coefficient that is at least about $50 \times 10^{-6}$ $K^{-1}$ greater than the first thermal expansion coefficient. The solid state material and polymer layer are exposed to a change in local temperature from a first temperature to a second temperature below the first temperature to cause the solid state material to fracture along a plane at a depth in the material, to produce at least one free-standing solid state layer from the solid state material.

In a further method provided by the invention for producing a free-standing solid state layer, a solid state material is provided having two opposing surfaces available for layer formation on each of the two surfaces, and a layer of polymer is formed on each of the two surfaces. Then the solid state material is caused to fracture along a plane at a depth in the material, to produce at least two free-standing solid state layers from the solid state material.

Further, in an additional method for producing a free-standing solid state layer provided by the invention, a solid state material is provided having at least one surface available for layer formation thereon and a layer of polymer is formed on the available surface. Then the solid state material is caused to fracture along a plane at a depth in the material, to produce a structure comprising a free-standing solid state layer and, adhered to a first surface thereof, the layer of polymer. A layer of polymer is then formed on a second surface of the free-standing solid state layer, the second surface opposing the first surface, and the free-standing solid state layer is then caused to fracture along a plane at a depth therein, to produce first and second additional structures each comprising a free-standing solid state layer and, adhered to a first surface thereof, a layer of polymer.

These processing techniques provided by the invention are particularly advantageous in that substantially no material loss of the solid state material or the produced free-standing layers occurs during the processing. This enables repeated cycling of the material, and with each cycle, production of additional layers, with one or more of those layers employed in subsequent cycles to produce further layers if desired. Further, each cycle is particularly efficient and substantially automatic, requiring little manual effort, and requiring no custom equipment or handling apparatus. A large number of relatively thin, free-standing layers can therefore be produced by the processing of the invention in a manner that was conventionally unachievable.

Other features and advantages of the invention will be apparent from the following description and accompanying figures, and from the claims.

BRIEF DESCRIPTION OF THE DRAWINGS

FIG. 2 is a perspective schematic view of three free-standing solid state layers produced in accordance with the invention from a starting solid state material; and FIG. 3 is a perspective schematic view of two solid state layers produced in accordance with the process of FIGS. 1A-1D and the four solid state layers that are similarly produced by a subsequent cycle of the process of FIGS. 1A-1D.

DETAILED DESCRIPTION OF THE INVENTION

Figure 1A:
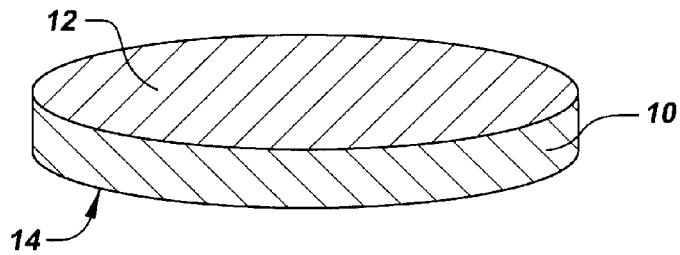
FIGS. 1A-1D are perspective schematic views of example fabrication process steps provided by the invention for thermally processing a starting solid state material with a polymer to produce free-standing solid state layers.

Referring to FIG. 1A, the thermal processing techniques provided by the invention can be employed to produce free-standing layers from a starting solid state material 10. As explained in detail below, the starting solid state material can be provided in the form of a conventional microelectronic wafer, as a substrate, a disk, a bulk piece, or other suitable configuration. Any particular term employed herein to describe the geometry of the starting solid state material is meant to be instructive for an example only and is not intended to be limiting; in the description below the starting structure will be referred to as the "solid state material" without reference to a particular shape, with the understanding that the material is provided in a selected substrate, wafer, bulk, or other form. The term "solid state" is herein meant to refer in general to non-biological materials and is not limited to a particular material composition.

The solid state material 10 is provided with a first exposed face, or surface, 12 and if desired, with a second exposed face 14, each face being available for accepting formation of one or more layers of material thereon. As described in detail below, the one or more layers can be formed on the faces by deposition, manual attachment or adherence, growth, or other process for disposing a layer on the available surface or surfaces. No particular formation process is required for providing a layer at the surfaces. The exposed faces are shown in FIG. 1A as being opposite and parallel, but such is for descriptive purposes only and is not in general required by the invention, as described in detail below.

Figure 1B:
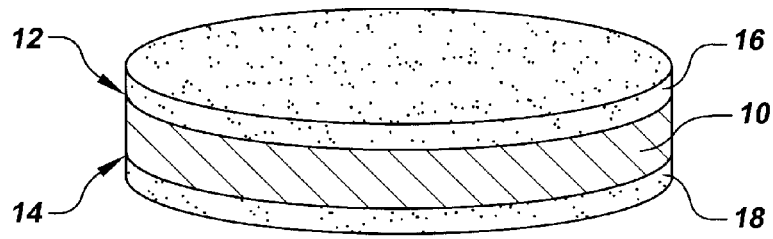

Briefly, in general, in a first process step, as shown in FIG. 1B, a layer 16 of polymer material is formed on the first face 12 of the solid state material 10, and if desired for a given application, a layer 18 of polymer material is also formed on the second face 14 or other faces of the solid state material 10. The thickness, composition, and characteristics of the polymer material are selected, as described in detail below, based on a desired thickness for a final free-standing layer or layers to be produced from the solid state material. In general, as explained below, the polymer material is characterized by a thermal expansion coefficient that is different than, and preferably greater than, the thermal expansion coefficient of the solid state material 10.

Figure 1C:
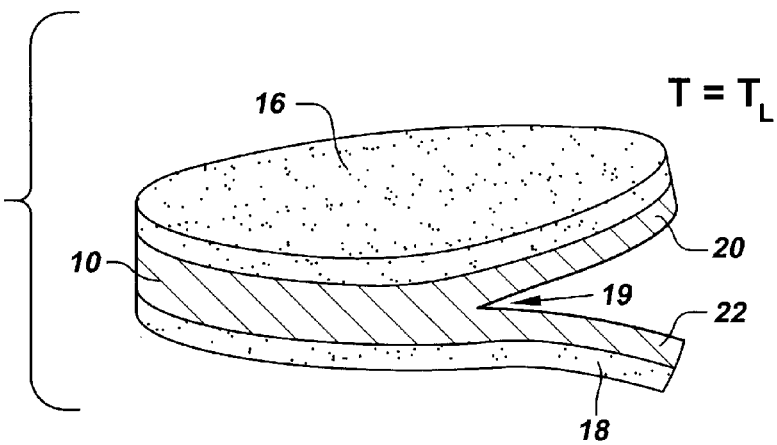

Referring to FIG. 1C, in one embodiment, with the polymer layer or layers 16, 18 in place on one or more faces of the material 10, the layered structure is subjected to thermal processing by exposure to one or more environments that change the temperature local to the layered structure from a first, high temperature, $T_H$, to a second, low temperature, $T_L$. As the local temperature approaches, reaches, and/or falls below the low temperature, $T_L$, the material 10 spontaneously fractures, or splits, from a surface of the material that is free of the polymer layer or layers 16, 18, along at least one internal fracture plane 19, due to thermally-induced mechanical stress in the material produced by the strongly differing thermal expansion coefficients of the material and the polymer layer or layers thereon. The fracture plane is at some depth in the thickness of the material that can for many conditions extend substantially at a constant depth with respect to the polymer-material interface. The fracture plane therefore extends to the extent of the polymer layer on the material. As the material fractures, two or more free-standing layers 20, 22 are formed from the original material, with free-standing layers contacted to a corresponding adjacent polymer layer 16, 18, respectively, while at the low temperature, $T_L$.

Figure 1D:
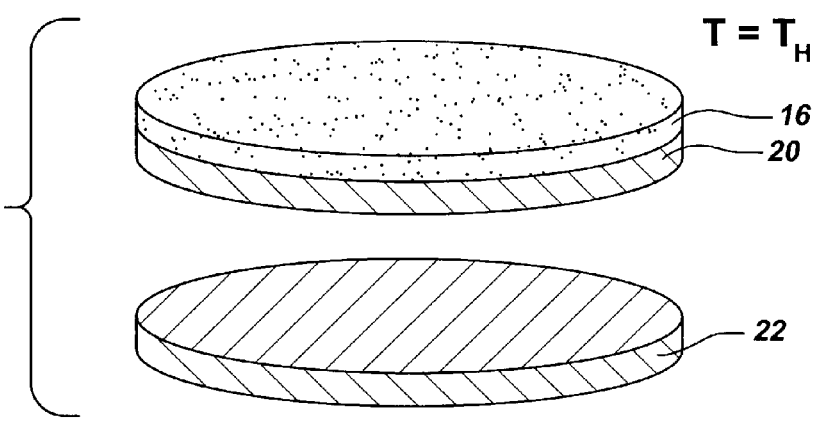

Referring to FIG. 1D, in a next process step, the two or more thusly produced free-standing layers 20, 22 are subjected to thermal processing by exposure to one or more environments that change the temperature local to the free-standing layers from the low temperature, $T_L$, back to a selected temperature relative to the high temperature, $T_H$. The resulting free-standing layers 20, 22 can then be employed as-desired for an intended application or applications. For example, a free-standing layer 20 can be maintained with a polymer layer 16 thereon for further thermal processing to produce additional free-standing layers, in the manner described below; the polymer layer can also be maintained in place for purposes of an intended application, if such a configuration is suitable. One or both of the free-standing layers 22 can alternatively be processed to remove the polymer layer for use in an intended application or other processing sequence.

The production of a pair of free-standing layers 20, 22, by the thermal processing of the invention is not in particular required; other layer configurations can also be produced by the thermal processing. For example, referring to FIG. 2, the thermally-induced mechanical stress in the solid state material at the low temperature, $T_L$, can produce two fracture planes, each at a different depth in the thickness of the material, resulting in three free-standing layers 20, 22, 24. Two of the layers are here each adjacent to one of the polymer layers 16, 18, and the third layer, having been formed from the central bulk of the material, has no adjacent polymer layer.

Referring to FIG. 3, any suitable number of cycles of the thermal process of the invention can be carried out to repeatably thin layers that were produced by prior cycles. For example, two free-standing layers 20, 22 produced by a first thermal process, as in FIG. 1C, can each be provided with two polymer layers, 16, 26, and 18, 28, respectively, for subsequent thermal processing. Fracturing of the two layers 20, 22, by a second thermal process can then be carried out to produce four free-standing layers 30, 32, 34, 36. Each of these four layers can in the same way be provided with polymer layers for a third thermal process carried out to produce eight free-standing layers. With this technique, three thermal process cycles can produce eight free-standing layers. As a result, a 400 μm-thick starting material, e.g., a conventional 4 mm-thick silicon wafer, can be processed to produce eight 50 μm-thick free-standing layers.

This cyclic thermal processing technique provided by the invention demonstrates one of the important advantages of the invention, namely, that substantially no loss of the free-standing layer material occurs during the thermal processing. This enables repeated cycling of the material, and with each thermal cycle, production of additional layers, with one or more of those layers employed in subsequent cycles to produce further layers if desired. Further, each thermal cycle is particularly efficient and substantially automatic, requiring little manual effort during each thermal cycle, and requiring no custom equipment or handling apparatus. A large number of relatively thin, free-standing layers can therefore be produced by the thermal processing cycles of the invention in a manner that was conventionally unachievable.

The solid state material to be thermally processed in accordance with the invention for producing free-standing layers is in general any material in which mechanical stress can be thermally induced to cause fracture along an internal plane of the material. Many such materials are characterized as being relatively brittle, or as having ceramic or glass-like characteristics, as a material from a class of glasses. The material can be monocrystalline, polycrystalline, or amorphous, or exhibit some combination of grain morphology. No particular crystal orientation is required, and accordingly, a crystal orientation can be selected that best suits a given application of the layers to be produced.

Example solid state materials for which the thermal process of the invention is particularly well-suited include microelectronic materials, such as semiconducting materials, e.g., II-VI and III-V semiconducting materials, as well as electrically insulating and electrically conducting materials. Silicon, germanium, silicon nitride, silicon carbide, diamond, quartz, sapphire, graphite, ceramics, glasses and other such materials are examples of well-suited solid state materials. The material can be electrically doped and can be homogeneous or heterogeneous in chemical composition and electrical or mechanical structure. The invention is not limited to a particular material, however; all that is required is an ability to thermally induce mechanical stress that causes fracture along at least one internal plane of the material. For many applications it can be preferred that the material withstand a fracture along the full planar extent of the material without shattering. As explained in detail below, the polymer characteristics can also be selected to aid in this process.

Whatever material composition is selected for producing the free-standing layers, the form of the material can be selected for a given application and is not limited by the invention. Conventional microelectronic wafers can be employed, as can be employed material disks, here defined as being thicker than a conventional wafer, or material substrates, here defined as being thinner or thicker than a conventional wafer. Chips or pieces of substrates, disks, or wafers can also be employed. The process can be carried out with large bulk pieces of material, including, e.g., ingots, blocks, and bulk chunks.

The starting material can be provided in almost any arbitrary shape and is not limited to a plan parallel structure, i.e., is not limited to a structure having two opposing flat surfaces that are parallel to each other. If it is desired to produce flat free-standing layers then it is sufficient that at least one surface of the starting material be flat and available for formation of adhesion of a polymer layer thereon. But in accordance with the invention, the starting material need not have any flat surfaces, and can be provided with surfaces having a cylindrical, spherical, or other shape. Free-standing curved layers or shells can be produced from such correspondingly-curved material surfaces.

The surface of the starting material need not be planar and can possess surface topology or surface features, including microelectronic, microelectromechanical, and structural devices and systems and structural arrangements. In this regard, the starting material can be provided with one or more surface layers or structures, devices, circuits, electrical and/or mechanical interconnections, or other features. Whatever features or topology are provided on the surface of the starting material, it is preferred that such do not significantly impair adhesion of a polymer layer to be provided on the surface of the material. The material surfaces can be polished, as with commercial silicon wafers, or can exhibit significant roughness, so long as a polymer layer can be provided with significant adhesion to the material surface.

The starting material thickness is preferably selected based on the desired thickness of free-standing layers to be produced and the number of thermal cycles to be carried out in the production of those layers. For some materials and applications, it can be preferred for relatively larger-diameter material forms to have a correspondingly greater thickness to ensure that the material does not shatter as it is fractured along an internal plane of the material. In general, the invention imposes no limitation on the planar extent or thickness of a starting solid state material form, although for many applications a solid state structure having a thickness of at least about 10 µm, and more preferably at least about 100 µm can be advantageous.

For many applications, such as the production of silicon photovoltaic or solar cells, the starting solid state material can be provided as one or more silicon wafers. For example, a monocrystalline silicon wafer, e.g., a Czochralski-grown silicon wafer of, e.g., 3-inch-diameter, 5-inch-diameter, or other selected size, having a thickness of, e.g., 0.35 mm or other thickness, that is n-type or p-type doped, can be employed as-produced. The wafer can be cleaned prior to the thermal process cycle of the invention, e.g., with conventional RCA or other cleaning sequence, and can be processed, e.g., to produce microelectronic and/or microstructural devices and/or systems on or near to the surface of or in the bulk of the wafer.

The polymer to be formed on at least one surface of the solid state material is characterized by a thermal expansion coefficient (TEC) that is different than the TEC of the solid state material, and for many applications, preferably that is greater than the TEC of the solid state material, at room temperature. In one embodiment of the invention, the polymer is characterized by a TEC that is greater than about $50 \times 10^{-6}$ K$^{-1}$ at room temperature. Preferably, the polymer is characterized by a TEC that is greater than about $100 \times 10^{-6}$ K$^{-1}$ at room temperature, and more preferably, the polymer is characterized by a TEC that is greater than about $200 \times 10^{-6}$ K$^{-1}$ at room temperature.

In another embodiment of the invention, the polymer is selected such that the difference between the TEC of the polymer and the TEC of the solid state material ($\Delta$TEC) relates to the range in temperature between the high temperature, $T_H$, and the low temperature, $T_L$, of the thermal process. For example, for a temperature difference, $\Delta T$, between the high temperature, $T_H$, and the low temperature, $T_L$, that is about 200° C., a $\Delta$TEC of at least about $50 \times 10^{-6}$ K$^{-1}$ between the polymer and the starting solid state material can be preferred in this embodiment. Accordingly, given that the TEC of silicon is about $3 \times 10^{-6}$ K$^{-1}$ at room temperature, a polymer having a TEC that is greater than about $53 \times 10^{-6}$ K$^{-1}$ is in this embodiment preferred. For a $\Delta T$ of about 200° C., a $\Delta$TEC of at least about $100 \times 10^{-6}$ K$^{-1}$ between the polymer and the starting solid state material can be more preferred, and a $\Delta$TEC of at least about $200 \times 10^{-6}$ K$^{-1}$ can be even more preferable for many applications. In other embodiments of the invention, the temperature range for the thermal processing is controlled for a given $\Delta$TEC, whereby no particular $\Delta$TEC is required between the polymer and solid state material, as described further below.

The polymer is characterized by an ability to significantly adhere to the surface of the solid state material. Good adhesion between the solid state material and the polymer is in general preferred for the entire temperature range $\Delta T$, between the high temperature, $T_H$, and the low temperature, $T_L$, of the thermal process. The polymer is further characterized by an elasticity that is sufficient to prevent fracturing, shattering, and delaminating of the polymer across the temperature range $\Delta T$, between the high temperature, $T_H$, and the low temperature, $T_L$, of the thermal process. The polymer is therefore sufficiently strong to withstand thermally-induced mechanical stress at the low temperature, $T_L$, of the thermal process, while maintaining sufficient adhesion to the solid state material as the temperature is changed and as the solid state material fractures.

Thus, the polymer is characterized by adhesion to the solid state material that is sufficient to maintain mechanical connection with the solid state material even as the whole layered structure deforms under thermal stress, during fracture, while accommodating internal strain due to the $\Delta$TEC between the polymer and the solid state material. In one example embodiment, the polymer becomes internally stiffer as the temperature is lowered, so that the polymer contracts at lower temperatures, but maintains mechanical robustness and adhesion to the solid state material as mechanical stress is induced at the lower temperatures and the solid state material fractures. In other words, the polymer can become "harder" during cooling and "softer" during heating, all while maintaining good adhesion to the solid state material. Some polymers with these behavioral properties can be characterized as, e.g., an elastomer, having sufficient elasticity, or flexibility, and sufficient adhesion properties to accommodate thermally-induced mechanical stress.

Polymers such as cross-linked polydimethylsiloxane (PDMS) are particularly well-suited for the thermal process of the invention. PDMS molecules are characterized by quite flexible polymer backbones, or chains, due to their siloxane linkages. Such flexible chains become loosely entangled, when the molecular weight is high, resulting in PDMS typically having an unusually high degree of viscoelasticity that is further increased by cross-linking the chains. Cross-linked PDMS acts like an elastic solid, similar to rubber, and it maintains these properties down to very low temperatures. Cross-linked PDMS further is characterized by a glass transition temperature that is very low, −120° C., and thus can be cooled significantly without becoming brittle.

These characteristics of PDMS describe the properties that are in general preferred for a polymer to perform across the temperature range, $\Delta T$, of the thermal process of the invention to enable fracture of a relatively more brittle solid state material at the low temperature while not itself also fracturing and also maintaining adhesion to the solid state material during the solid state fracture process. Thus, the polymer is in general characterized by a glass transition temperature that is below the high temperature and that is substantially low to prohibit shattering or fracturing of the polymer at the low temperature.

PDMS is characterized by a TEC of about $300 \times 10^{-6}$ $K^{-1}$. This extremely high TEC results in a $\Delta$TEC with silicon of about $297 \times 10^{-6}$ $K^{-1}$. Such a large difference in TEC enables an effective thermal process for silicon starting material that does not require an extremely wide temperature range, and therefore that is highly efficient and cost effective. PDMS can be provided in any suitable form or structure, obtained commercially, e.g., as Sylgard 184 from Dow Corning Corp. The invention does not require a particular starting form or formulation for PDMS.

Any material that behaves in the manner of a polymer such as PDMS can be employed as the applied polymer layer in accordance with the invention. For example, polymers such as thermoset polymers, poly(ethylene terephthalate) (PET), elastomeric materials, rubbers, epoxies, plastics, or other materials that can be provided with sufficient elasticity, flexibility, and mechanical robustness can be employed. So long as a selected material provides these requisite characteristics while also providing sufficient adhesive properties to maintain mechanical connection to the solid state material, such can be employed. For clarity, in the description herein, the term "polymer" is be used to refer to any material that can provide the polymeric qualities, like PDMS, that enable thermal processing for fracture of a material as just described. If desired, an adhesive agent, such as hexamethyldisilazane (HMDS), a polymer itself, e.g., PDMS itself, or other selected material, can be employed to enhance the adhesion of a selected polymer to the solid state material, or to adhere the polymer to the solid state material.

The thickness of a polymer to be applied to a solid state material is preferably selected based in part on the desired thickness of free-standing layers to be produced. For many material systems, the dimensions and/or tunable properties of the polymer layer determine the thickness of a free-standing layer that is fractured from the starting solid state material. Accordingly, as a sequence of thermal cycles is carried out, a different polymer thickness can be employed for each cycle, based on the thickness that is desired for the free-standing layers to be produced. The polymer thickness is also preferably selected based on the flexibility and robustness of the polymer over the temperature range of the thermal process.

For the polymer PDMS, a thickness of at least about 0.01 mm can be employed for many applications, with a thickness of between about 0.1 mm and about 5 mm more preferred, and with a thickness of between about 0.3 mm and about 3 mm more preferably for many applications; e.g., a thickness of about 1 mm can be preferred, when desired to obtain a corresponding free-standing layer thickness. But the invention is not limited to a particular polymer thickness. If the polymer is to be applied to two surfaces of a starting solid state material, the polymer thicknesses can be the same for each surface or each surface layer can be of a differing thickness. For many applications in which the solid state material is relatively flexible and bends easily, it can be preferred to form a polymer layer on two opposing surfaces of the material, as in FIG. 1B, to maintain mechanical stress balance across the layered structure before the solid state material is caused to fracture, to prevent bending of the structure.

If desired, composite layers of differing polymer and other materials can be applied to the starting solid state material. Whether homogeneous or heterogeneous, layers of material can be sequentially formed by various deposition or other techniques. The polymer material can be characterized by an internal structure, e.g., as a laminate, can have structured surfaces, e.g., nanoscale fibril structures, and can include one or more species and/or particles provided through the thickness of the polymer. No particular polymer composition or configuration is required. All that is required is for the applied layer or layers to provide a thickness that is commensurate with the desired free-standing layer thickness, to provide adhesion and material properties that can withstand the mechanical stress induced over the temperature range of the thermal process, and to be characterized by a sufficiently large $\Delta$TEC with respect to the solid state starting material to cause fracture of the solid state material.

It is preferable that the polymer be prepared and disposed on the solid state material in a manner that preserves the material characteristics of the polymer, whether the polymer is provided on the material by deposition, growth, manual application or adherence, or other procedure. For example, in formation of a PDMS layer on a solid state material, in a first step, a mixing ratio of about 1:10 between curing agent and base material can be employed to produce a liquid PDMS mixture. The liquid PDMS mixture is then preferably degassed for, e.g., about 1 hour, in vacuum, and then applied to a selected starting material. If the degassed mixture is not used promptly, the mixture could cure before its application to the starting material. It is therefore preferred that the mixture be applied to a starting material less than five hours after mixing.

PDMS and other polymeric materials are sensitive to ambient humidity and can absorb water from the ambient. It is therefore preferred to control the ambient humidity of the environment in which the PDMS or other polymeric material is formed, applied to the solid state material, and subjected to thermal processing. Above an ambient humidity of about 70%, the properties of PDMS or other polymeric material can become degraded to an extent sufficient to render the polymer inoperable for the thermal process of the invention. The humidity of the ambient in which the polymer is applied to the starting material is therefore preferably controlled.

The polymer can be formed on the starting material by any convenient process. For example, liquid polymeric mixtures can be poured, spin-coated, vapor-deposited, sprayed, screen printed, painted or otherwise applied to one or more surfaces of a starting material. Alternatively, the starting material can be dipped, immersed, or otherwise submerged in a liquid polymeric mixture. The polymer can alternatively be formed on the starting material from a gaseous state, e.g., by CVD or plasma processing, and as with a liquid polymer, solidified on the material. The polymer can further be applied directly as a solid layer to the material by, e.g., gluing, plasma-bonding, or otherwise adhering a solid polymer layer to the starting material. Adhesion between the polymer layer or layers and the solid state material can be achieved by chemical bonding, by van der Waals force, or by other strong adhesive force.

The use of a polymer in accordance with the invention provides particular advantages. For example, in general, polymers are benign to the solid state material on which they are applied and do not in general contaminate a solid state material such as silicon. Polymers such as PDMS easily adhere to a wide range of solid state materials, including, e.g., Si, Ge quartz, sapphire, and glass. The polymer layer application to a solid state material is in general relatively efficient and cost effective, given the relatively low cost of polymers, does not require extreme temperatures, and can be accomplished by a variety of techniques. Many polymers are characterized by a TEC that is significantly higher than that of solid state materials of interest such as silicon, and therefore enable highly efficient fracturing of a solid state material to produce free-standing layers from the material at reasonable temperatures.

Further, the thickness of an applied polymer layer can be well controlled and easily tuned to achieve selected fracture characteristics. In addition, polymers can in general be easily removed from a solid state material and any polymer trace remaining on the material is in general relatively benign As a result, polymer materials are preferred in accordance with the invention as opposed to, e.g., metals, which can contaminate a solid state material such as silicon, are characterized by relatively low TEC, are expensive, and for which thickness cannot be easily tuned.

It is preferred that the edges of the starting material surfaces on which the polymer material is applied are maintained uncovered. If edges of the starting material, e.g., the circumference of a silicon wafer, are coated during the polymer application, it is preferred that the edges be processed to remove material at edge locations. Such is required to enable a mechanical stress to develop at the edges of the material during thermal processing such that fracture along a plane at some depth in the thickness of the material can develop.

During or after the polymer application or formation on the starting material, the polymer is cured, if required. For example, after application of a liquid PDMS mixture to one or more surfaces of a starting material, the PDMS is cured by placing the layered structure, e.g., on a hot plate, for example at a temperature of about 200° C. for a sufficient curing duration, e.g., 30 minutes. Thermal curing can in general be carried out at a temperature, e.g., between about 10° C. and about 100° C. Any curing technique can be employed, e.g., on a hotplate, by exposure to infrared (IR), ultraviolet (UV) or other radiation, chemical curing, or other technique. After curing, any polymer material that extends over the edges of the starting material is preferably removed, e.g., by manual cutting, by etching, or by other technique, such that only one or more surfaces of the starting material are covered with a polymer layer and all edges of those surfaces are uncovered.

After curing, additional thermal processing above room temperature can be carried out if desired for a given application. For example, residual tensile stress can be imposed on a layered structure by carrying out one or more high-temperature process steps prior to the material fracture processing step. Such residual tensile stress can enhance the ability to fracture the starting material during the thermal process. Polymeric curing is itself a high-temperature step that imposes some degree of residual tensile stress on the layered structure. Additional high-temperature exposure is not required and may not be desired for all applications.

Once a polymer is provided on a selected one or more surfaces of a starting solid state material, e.g., as in FIG. 1B, and any optional additional thermal steps are carried out, the thermal processing is begun to adjust the temperature locally at the structure between two temperatures, e.g., from a first, high temperature, $T_H$, to a second, low temperature, $T_L$. The high and low temperatures are preferably selected based on the characteristics of the solid state material and the polymer and the dynamics of the fracture mechanism.

The high temperature, $T_H$, of the thermal processing is in one embodiment below about 300° C., which for many polymers is below the temperature at which properties of the polymer are irreversible changed. The high temperature is never above the melting temperature or decomposition temperature of the polymer. More preferably the high temperature, $T_H$, can be below about 100° C.

In a further embodiment, after any optional thermal steps, the layered structure can optionally be brought substantially to room temperature, and the thermal processing begun to adjust the temperature locally at the structure from the first, high temperature, $T_H$, to a second, low temperature, $T_L$. The thermal processing can begin immediately after cooling down from high-temperature curing or other high-temperature step. The high temperature, $T_H$, is in general in this embodiment about room temperature, that is, an ambient temperature of about 20° C.±about 10° C. In this embodiment, once the layered structure is cooled to room temperature, the temperature local to the structure can be immediately controlled to continue cooling of the structure to the low temperature, $T_L$.

In accordance with the invention, the low temperature, $T_L$, to which the layered structure is cooled is below room temperature. In a further embodiment, the low temperature, $T_L$, is no greater than about −20° C. In other words, the local temperature of the layered structure is reduced to a low temperature, $T_L$, that is no higher than about −20° C. The low temperature, $T_L$, can be reduced substantially below −20° C. and for many applications it can be preferred to reduce the temperature to below about −100° C., or more preferably to reduce the temperature to no greater than the boiling temperature of liquid nitrogen, −195° C., or lower, e.g., to the boiling temperature of liquid helium, −265° C. In general, the low temperature preferably is below the glass transition temperature of the polymer.

This low-temperature cooling in accordance with the invention, below room temperature, to induce solid state material fracture, provides many important advantages. For example, the low-temperature processing dramatically reduces the potential for solid state material contamination that could occur due, e.g., to diffusion of species into the solid state material at higher temperatures. Low-temperature processing further dramatically reduces chemical or other reactions between the solid state material and the polymer layers or other materials provided at the solid state material. Low process temperatures are also much more benign to delicate solid state materials and structures that could melt, decompose, or otherwise degrade at elevated temperatures. In addition, for many configurations of a solid state material and polymer layers, where the polymer is formed on the solid state material at around room temperature, the layered structure is essentially stress-free at room temperature, but high-temperature processing could impose high stress at room temperature, whereby the layered structure could fracture or shatter at room temperature. The low-temperature cooling of the invention, below room temperature, preserves the essentially stress-free state of the layered structure at room temperature and thereby preserves the mechanical integrity of the structure at room temperature.

In general, the low temperature to which the layered structure is cooled is preferably selected based on the expected behavior of the solid state material and the polymer as the temperature is lowered. As explained above, as the temperature is lowered, mechanical stress is induced in the solid state layer due to the difference in TEC, that is, $\Delta$TEC, between the more brittle solid state material and the more flexible polymer layer or layers. At some characteristic low temperature, the induced stress in the solid state material is sufficient to cause the solid state material to spontaneously fracture, or split, along one or more internal fracture planes. The temperature at which such spontaneous fracture occurs varies as a function of the $\Delta$TEC between the solid state material and the polymer.

For layered structures characterized by a large $\Delta$TEC, less cooling is required to cause spontaneous fracture than is required for layered structures characterized by a small $\Delta$TEC. Thus, the low temperature is preferably selected based on the $\Delta$TEC of a given solid state material and selected polymer, based on the temperature at which the polymer is formed on the solid state material, and based on any previous thermal processing, such as polymer curing or other high temperature steps. For example, given a silicon wafer as the starting material and PDMS as the polymer, a low temperature that is below about the glass transition temperature of PDMS, −120° C., can for many conditions be sufficient to cause spontaneous fracture of the silicon wafer, and around the boiling temperature of liquid nitrogen temperature, −195° C., the temperature is quite sufficient to cause spontaneous fracture of the silicon wafer.

The layered structure can be exposed to a selected low temperature, $T_L$, directly from the high temperature, or the temperature can be ramped down from room temperature to the low temperature. The invention does not require a particular speed in cooling. Once the temperature local to the structure is sufficiently low to cause spontaneous fracture of the solid state material, i.e., once near to, at, or below the low temperature, $T_L$, the layered structure is maintained at about that temperature until fracture occurs.

The duration of exposure to the low temperature that is required for fracture can depend on the amount of material in the layered structure, the surface area of the structure, the heat capacity of the materials in the layered structure, the thermal conductivity of the materials in the structure, and the difference in temperature between room temperature and the temperature at which fracture is expected to occur, among other considerations. The invention does not require a particular duration of exposure to a low temperature; all that is required is sufficient duration of exposure to the low temperature to cause spontaneous fracture of the solid state material.

The layered structure is exposed to one or more environments, as in FIG. 1C, to produce the selected low temperature, $T_L$, local to the layered structure. The environment can produce cooling by solid, liquid, or gaseous means, and can be produced by passive or active cooling configurations. Liquid cooling can be enabled by, e.g., liquid helium, liquid nitrogen or other liquefied gas, ice water or other iced liquid mixtures, cooled alcohols such as ethanol, or other cooled liquid such as cryogenic fluids. The layered structure can be dipped or immersed in the cooling liquid, the cooling liquid can be directed to flow across one or more surfaces of the layered structure, or the cooling liquid can be dispensed, e.g., from a reservoir to the vicinity of the layered structure.

The invention does not require a particular cooling mechanism, but does require that sufficient thermal contact be made between the layered structure and the cooling environment to produce thermally-induced mechanical stress in the layered structure. For example, the layered structure need not be exposed directly to a cooling liquid, instead making thermal contact with the cooling liquid through an intermediate layer or structure. In one embodiment of such, a boat or other holder, formed of, e.g., metal or other good thermal conductor, is provided for holding the layered structure, with the outside of the boat provided in thermal contact with a cooling liquid, and the inside of the boat in thermal contact with the layered structure. This configuration can be preferred for delicate layered structures that are particularly sensitive to handling, and for reducing temperature in-homogeneity at the surface of the layered structure due, e.g., to formation of bubbles in the cooling liquid. Other such configurations are contemplated by the invention for providing an intermediary material or structure that transfers cooling from a liquid or other coolant to a layered structure while physically but not thermally isolating the layered structure from the coolant.

As explained above, the cooling environment can be produced by active or passive means. For example, an active element such as a thermo-electric cooler, e.g., a peltier element, can be employed directly on the layered structure or with a medium to be cooled for in turn cooling the layered structure. Other thermo-electric coolers and active heat sinks, as well as active cooling systems such as refrigeration, convection, or other systems can be employed to directly cool the layered structure or to cool an environment to which the layered structure is exposed. Actively-cooled reservoirs or other systems can accordingly be employed.

Gaseous cooling environments can also be employed in accordance with the invention. For example, cooled nitrogen or other gas can be blown across or around a layered structure to cool the structure. The layered structure can further be provided in contact with or in the vicinity of a cooled solid, such as dry ice or other solid. Intermediate structures can be employed here for supporting the layered structure and physically but not thermally isolating the structure from the cooling solid. Further in accordance with the invention, combinations of liquid, gas, and solid cooling means can be employed to produce a selected cooling environment that is directly applied to the layered structure or in the vicinity of the layered structure.

Once the cooling environment induces sufficient mechanical stress to cause the solid state material to fracture in the manner described above, the resulting two or more free-standing layers are retrieved from the cooling environment and preferably are warmed, completing the thermal processing cycle. As shown in FIG. 3, for many applications, after the fracture is complete, two or more free-standing layers 30, 32, 34, 36 will include a polymer layer on one face of the layer. The warming process is preferably carried out with the polymer layer maintained in place on the free-standing layer.

For many solid state material-polymer combinations, e.g., silicon free-standing layers having a PDMS layer thereon, it is preferable to warm the free-standing layers to a temperature that is preferably greater than about 10° C. below the high temperature from which the thermal process began, or for many applications, to about room temperature, to preserve the mechanical integrity of the layers. Breaking of the layers perpendicular to the plane of the layers can occur if the layers are not returned to the low-stress starting temperature of the thermal process. For many material combinations such as silicon and PDMS, the thermally-induced stress of the thermal process causes the structure to tend to bend as fracturing proceeds, as shown in FIG. 1C, particularly for thin solid state layers. The brittleness of the solid state material, in combination with this structural bending, can cause the free-standing layers to break apart. It is therefore preferable, once the free-standing layers are fully produced, to remove them from the cooling environment and to warm them, preferably to about the low-stress starting temperature, $T_H$, of the thermal process.

No particular warming process is required by the invention. The free-standing layers can be simply exposed to ambient conditions for passive warming, or can be actively warmed by, e.g., a hot plate, warming oven, or other warming environment to raise the temperature of the free-standing layers back to at least room temperature. For applications in which the polymer layer is formed or cured at a temperature higher than room temperature, it can be preferred to warm the free-standing layers to that polymer formation or curing temperature to maximize stress reduction in the free-standing layers. For example, for an embodiment in which a 200° C. curing step is carried out for, e.g., a PDMS polymer, it is preferred to warm the free-standing structures to at least room temperature and more preferably to about the 200° C. curing temperature. Here it can be preferred to place the free-standing layers on a hotplate with the polymer layer facing down on the hot plate. No particular temperature ramp rate is required by the invention.

Whatever warming procedure is employed, it is preferred that the free-standing layers be carefully pressed against a flat support as they warm so that any curling of the layers is reversed, to flatten the layers as the warming proceeds. In the case of free-standing layers that are produced from a curved solid state material it is preferred that the free-standing layers are pressed against a support having the same curvature as the original curved solid state material. Light pressure applied to the free-standing layers can be manual or through a mechanical element or configuration, or by other means such as magnetic or electrostatic forces, through a vacuum, or by other suitable means. Once the temperature of the free-standing layers is returned to room temperature or some higher temperature, the free-standing layers tend to easily maintain their non-stress shape, e.g., flat.

It is recognized in accordance with the invention that the thermally-induced fracture process described just above is in part enabled by the contraction of the polymer layer while adherence of the polymer layer to the solid state material. Therefore, the solid state material fracture can be caused in accordance with the invention by processes, other than thermal processes, that result in contraction of the polymer layer in a manner that causes the solid state material to fracture due to the adherence of the polymer layer on the solid state layer during contraction of the polymer layer. For example, a chemical reaction of the polymer layer with a reactive species that causes the polymer layer to contract can be employed to cause fracture of the solid state material. Exposure of the solid state material and polymer layer to an environment with selected conditions, such as selected pH, that cause the polymer to contract can further be employed. With such a technique, thermal processing of the polymer and solid state material is not necessarily required to cause the solid state material to fracture.

With the thermal or other processing complete and free-standing layers thusly produced in accordance with the invention, polymer layers can be removed from the free-standing layers if desired. Conventional liquid or gaseous etchants can be employed to remove the polymer layers. For example, given a PDMS layer on a free-standing silicon layer, the silicon layer can be immersed in a liquid etchant such as hydrofluoric acid or a 3:1 mixture by volume of N-Methylpyrrolidone (NMP) and Tetrabutylammoniumfluoride 1.0M solution in Tetrahydrofuran (TBAF/THF), or other suitable etchant. Plasma etching and other gaseous removal processing can also be employed. Other suitable removal processes include, e.g., ashing and rinsing. No particular polymer removal process is required by the invention.

The polymer layer can be maintained in place on the free-standing layer for subsequent processing. As explained above with regard to FIG. 1D and FIG. 3, a polymer layer can be maintained on one or more free-standing layers 20, 22 for additional cycles of thermal processing to produce additional free-standing layers in accordance with the invention.

With the thermal processing of the invention complete, there are produced two or more free-standing solid state layers possessing the mechanical, electrical, and structural properties of the starting solid state material. In general, during the low-temperature fracture process of the starting solid state material, the fracture plane interior to the material develops substantially parallel to the interface between the solid state material and the polymer layer, across the planar extent of the interface. As a result, the produced free-standing layers are characterized by a substantially uniform thickness across their extent. Depending on the fracture dynamics, the free-standing layers are further characterized by relatively smooth surfaces, having a surface roughness of usually no more than about 10 μm. The thermal process of the invention thereby is demonstrated to produce free-standing solid state layers having superior quality.

EXAMPLE

A commercially available, <100> oriented, single-side polished, 3-inch silicon wafer having a thickness of about 0.37 mm and a resistivity of about 10 Ω·cm, was employed as provided by Silicon Sense, Inc. A liquid mixture of PDMS, provided as Sylgard 184 from Dow Corning Corp. was mixed in a 1:10 ratio of curing agent and base material and degassed for one hour in vacuum. The mixture was then immediately poured on the polished front surface of the silicon wafer and allowed to equilibrate to a layer with substantially homogeneous thickness of about 1 mm and cured on a hotplate at a temperature of about 100° C. for about 30 minutes. The mixture was then poured on the back surface of the silicon wafer and allowed to equilibrate to a layer with substantially homogeneous thickness of about 1 mm and cured on a hotplate at a temperature of about 100° C. for about 30 minutes. In order to achieve the same PDMS thickness on both sides reproducibly the volume of PDMS mixture was measured before dispensing.

After curing, the composite silicon-PDMS layered structure was cooled to room temperature. Any PDMS protruding along the circumference of the wafer was removed with a sharp knife such that the edge of the wafer was completely free of PDMS. The layered structure was then completely immersed in a liquid nitrogen bath. After approximately ten seconds of immersion, the silicon wafer fractured into two free-standing silicon layers, each layer including a PDMS coating. The free-standing layers were removed from the bath and placed on a flat surface to warm back to room temperature. During the warming, light manual pressure was applied to the layers to flatten the layers. Once at room temperature and substantially flat, the PDMS layers were removed from the free-standing silicon layers.

With the PDMS layers removed, the thickness of the free-standing layers was measured with a caliper. The resulting thickness of each free-standing layer was measured to be approximately 0.18 mm, with a thickness variation of less than 20% across the layer. The surface roughness was measured to be below 10 μm over most of the surface area of the free-standing layer. Free-standing layers were processed into standard solar cells using a simple diffusion process and evaporated contact metallization on the front and back surfaces of the layers. Solar cell operation of the layers was confirmed, demonstrating that the fracturing process did not substantially degrade the electronic properties of the silicon layers.

This example demonstrates that with an elegantly simple, cost-effective, and rapid procedure, the thermal processing of the invention produces high-quality free-standing solid state layers that maintain the characteristics of a starting material from which they are produced. The process can be scaled to any reasonably sized starting structure and is not limited to planar or flat structures. Contamination and/or degradation of starting and produced materials is inhibited and no high-temperature treatments are required.

For many applications, and in particular for applications such as solar cell and photovoltaic applications, including concentrated photovoltaic applications and multi-junction solar cells, as well as flexible electronic circuit and substrate applications, solid state lighting applications such as LED manufacturing, and integrated circuit manufacturing including power electronic circuits, the thermal processing of the invention for producing free-standing semiconductor layers provides superior product with essentially no waste of material. The thermal processing can be integrated into an existing microfabrication sequence for, e.g., production of electronic or microelectronic systems, thin silicon wafers, or solar or photovoltaic cells or other application. The process is amenable to an extremely wide range of starting material compositions, thicknesses, geometric configurations, and other parameters, and can be scaled in size and in repetition of cycles. For many applications, the thermal processing of the invention therefore provides a superior technique for the production of free-standing solid state layers.

It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A method for producing a free-standing solid state layer comprising:
   providing a solid state material having a characteristic thermal expansion coefficient and having at least one surface available for layer formation thereon;
   forming a layer of polymer on the available surface such that adhesion is maintained between the solid state material and the layer of polymer for an entire predetermined temperature range $\Delta T$ between a first temperature and a second temperature, wherein the layer of polymer has a characteristic thermal expansion coefficient that is different from the thermal expansion coefficient of the solid state material; and
   exposing the solid state material and the adhered polymer layer to a change in local temperature from the first temperature that is no greater than about 300° C. to the second temperature, below about room temperature, thereby inducing mechanical stress in the solid state material due to the difference between the thermal expansion coefficient of the solid state material and the thermal expansion coefficient of the polymer layer, to cause the solid state material to fracture along an internal plane at a depth in the solid state material, wherein the polymer layer is characterized by a glass transition temperature that is below the first temperature and above the second temperature, and that is sufficiently low to prohibit shattering or fracturing of the polymer at the second temperature, to produce at least one free-standing solid state layer from the solid state material.

2. The method of claim 1 wherein the first temperature is about room temperature.

3. The method of claim 1 further comprising, after production of the free-standing layer, exposing the free-standing layer to a change in local temperature from about the second temperature to a temperature that is greater than about 10° C. below about the first temperature.

4. The method of claim 1 wherein providing a solid state material comprises providing a material selected from the group consisting of monocrystalline silicon, polycrystalline silicon, monocrystalline germanium, polycrystalline germanium, quartz, diamond, sapphire, graphite, silicon carbide, and a glass material.

5. The method of claim 1 wherein:
   providing a solid state material comprises providing a structure having two surfaces that oppose each other and that are substantially parallel to each other, and that each are available for polymer layer formation thereon;
   forming a layer of polymer comprises forming a layer of polymer on each of the two available surfaces; and
   producing at least one free-standing solid state layer from the solid state material comprises producing at least two free-standing solid state layers from the solid state material.

6. The method of claim 1 wherein providing a solid state material comprises providing a structure having a curved surface.

7. The method of claim 1 wherein providing a solid state material comprises providing a structure having a surface available for layer formation thereon that includes topological surface features.

8. The method of claim 1 wherein providing a solid state material comprises providing a structure including microelectronic devices.

9. The method of claim 1 wherein providing a solid state material comprises providing a II-VI semiconducting material.

10. The method of claim 1 wherein providing a solid state material comprises providing a III-V semiconducting material.

11. The method of claim 1 wherein providing a solid state material comprises providing a solid state structure having a thickness greater than about 10 microns.

12. The method of claim 1 wherein the polymer layer formed on the surface has a thickness that is at least about 0.01 mm.

13. The method of claim 1 wherein the polymer layer formed on the surface is characterized by adherence to the solid state material during exposure to the change in local temperature.

14. The method of claim 1 wherein the polymer layer formed on the surface is characterized as an elastomeric material.

15. The method of claim 1 wherein the polymer layer formed on the surface is characterized by a yield strength that prevents the polymer layer from fracturing or shattering as the solid state material is caused to fracture.

16. The method of claim 1 wherein the polymer layer formed on the surface comprises polydimethylsiloxane.

17. The method of claim 1 wherein the polymer layer formed on the surface is characterized by a glass transition temperature that is below the first temperature and that is sufficiently low to prohibit polymer fracturing as the solid state material is caused to fracture.

18. The method of claim 1 wherein the polymer layer formed on the surface is characterized by a thermal expansion coefficient that is at least about $50 \times 10^{-6}$ $K^{-1}$ greater than a thermal expansion coefficient that is characteristic of the solid state material.

19. The method of claim 1 wherein forming a layer of polymer on the available surface comprises applying a polymer to the surface in a liquid state and curing the liquid polymer to form a substantially solid polymer layer.

20. The method of claim 1 further comprising, after polymer layer formation, curing the polymer layer with radiation selected from the group of IR radiation and UV radiation.

21. The method of claim 1 wherein the second temperature to which the solid state material and the polymer layer are exposed is no higher than about −20° C.

22. The method of claim 1 wherein the second temperature to which the solid state material and the polymer layer are exposed is no higher than about liquid nitrogen boiling temperature.

23. The method of claim 1 wherein exposure of the solid state material and the polymer layer to a change in local temperature comprises exposure to a cooling liquid.

24. The method of claim 1 wherein exposure of the solid state material and the polymer layer to a change in local temperature comprises exposure to a cooling gas.

25. The method of claim 1 wherein exposure of the solid state material and the polymer layer to a change in local temperature comprises exposure to a cooling solid.

26. The method of claim 1 wherein exposure of the solid state material and the polymer layer to a change in local temperature comprises immersion in liquid nitrogen.

27. The method of claim 1 wherein exposure of the solid state material and the polymer layer to a change in local temperature comprises cooling of an intermediate structure disposed between a cooling environment and the solid state material and polymer layer.

28. The method of claim 1 further comprising:
maintaining the polymer layer on a surface of a produced free-standing layer;
forming a second polymer layer on an available surface of the produced free-standing layer that opposes the surface having the maintained polymer layer; and
exposing the free-standing layer and the polymer layers to a change in local temperature from the first temperature to the second temperature to cause the free-standing layer to fracture at a depth in the free-standing layer to produce at least one additional free-standing layer.

29. The method of claim 1 wherein the polymer is characterized by a thermal expansion coefficient that is at least about $100 \times 10^{-6}$ $K^{-1}$ greater than a thermal expansion coefficient that is characteristic of the solid state material.

30. The method of claim 1 wherein:
the polymer is characterized by a yield strength that prevents the polymer layer from fracturing or shattering at temperatures below about −20° C., and characterized by maintenance of adhesion to the available surface at temperatures below about −20° C.; and
the second temperature is no higher than about −20° C.

* * * * *